United States Patent [19]

Kuramitsu et al.

[11] Patent Number: 4,853,757
[45] Date of Patent: Aug. 1, 1989

[54] SEMICONDUCTOR INTEGRATED CIRCUIT

[75] Inventors: Yoichi Kuramitsu; Takahiko Arakawa, both of Itami, Japan

[73] Assignee: Mitsubishi Denki Kabushiki Kaisha, Tokyo, Japan

[21] Appl. No.: 287,525

[22] Filed: Dec. 19, 1988

Related U.S. Application Data

[63] Continuation of Ser. No. 31,731, Mar. 30, 1987, abandoned.

[30] Foreign Application Priority Data

May 7, 1986 [JP] Japan .................. 61-104293

[51] Int. Cl.$^4$ ............................. H01L 27/10
[52] U.S. Cl. ........................ 357/45; 357/40
[58] Field of Search .............. 357/45, 45 M, 40

[56] References Cited

U.S. PATENT DOCUMENTS

| | | | |
|---|---|---|---|
| 3,577,038 | 5/1971 | Cook, Jr. ............................ | 357/45 |
| 4,668,972 | 5/1987 | Sato et al. .......................... | 357/45 |

FOREIGN PATENT DOCUMENTS

| | | | |
|---|---|---|---|
| 0098163 | 1/1984 | European Pat. Off. ............ | 357/45 |
| 0189183 | 7/1986 | European Pat. Off. ............ | 357/45 |
| 3147932 | 6/1982 | Fed. Rep. of Germany ....... | 357/45 |
| 58-116757 | 7/1983 | Japan ................................. | 357/45 |
| 59-220948 | 12/1984 | Japan ............................. | 357/45 M |
| 60-34036 | 2/1985 | Japan ............................. | 357/45 M |

OTHER PUBLICATIONS

A Basic-Cell Buffer 440K-Transistor CMOS Masterslice, IEEE International Solid-State Circuits Conference, Feb. 19, 1986.
Cole, Bernard Conrad, "CAD, CMOS, and VLSI are Changing Analog World", Dec. 23, 1985, Electronics, pp. 35-39.
Cole, Bernard Conrad, "A Chip Business that is Still Growing," Jul. 22, 1985, Electronics, pp. 40-45.

Primary Examiner—Martin H. Edlow
Attorney, Agent, or Firm—Armstrong, Nikaido, Marmelstein, Kubovcik & Murray

[57] ABSTRACT

A semiconductor integrated circuit such as a master slice LSI, wherein a gate region and input/output cell regions in the periphery thereof are composed entirely of logic-constituting elements servable as input/output cells. The logic-constituting cells in the whole of the input/output cell regions and any desired portion of the gate region are formed as input/output cells in the slice process of production.

3 Claims, 3 Drawing Sheets

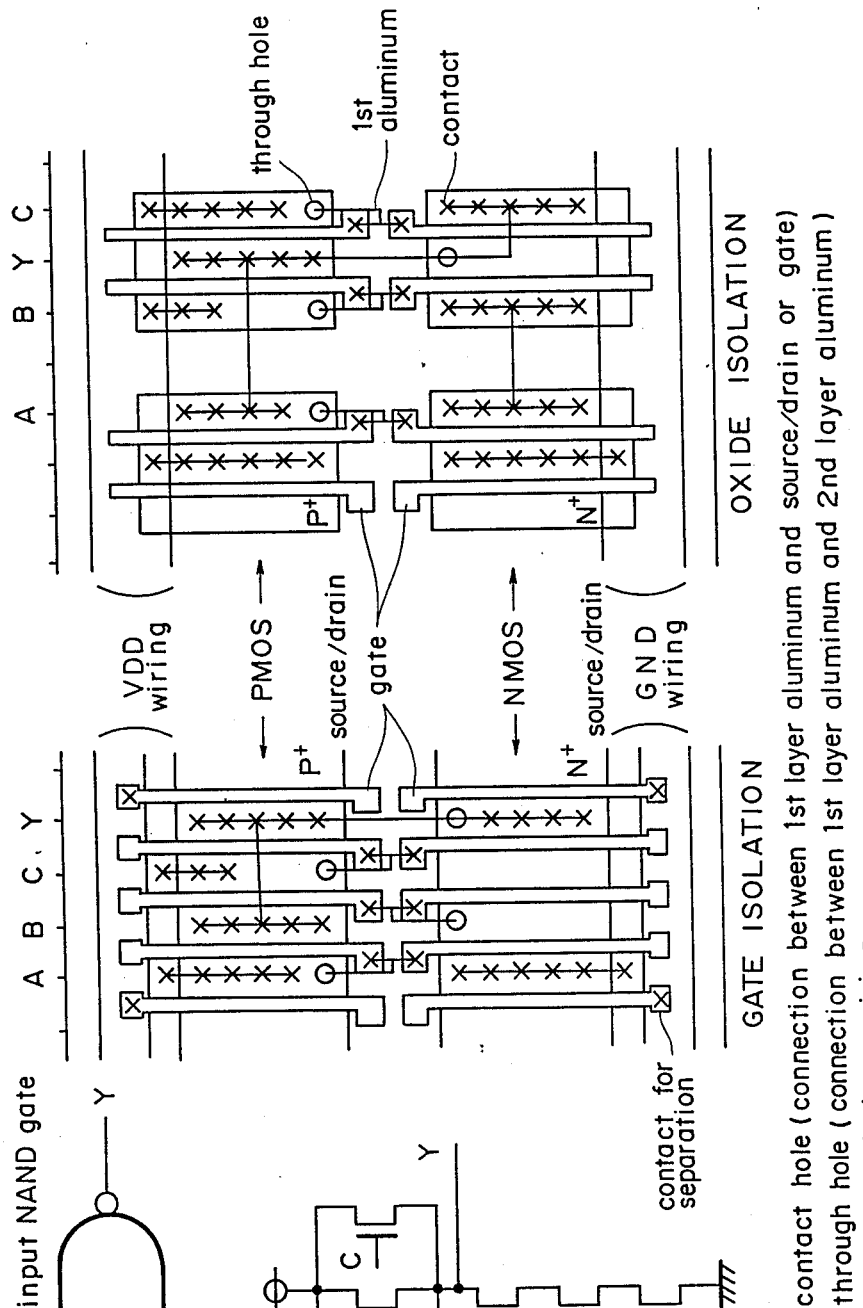
FIG. 5 3-input NAND gate
FIG. 6 GATE ISOLATION
FIG. 7 OXIDE ISOLATION
x ··· contact hole (connection between 1st layer aluminum and source/drain or gate)
O ··· through hole (connection between 1st layer aluminum and 2nd layer aluminum)
— ··· 1st layer aluminum wiring

SEMICONDUCTOR INTEGRATED CIRCUIT

BACKGROUND OF THE INVENTION

This application is a continuation of application Ser. No. 031,731, filed 3/30/87, now abandoned.

BACKGROUND OF THE INVENTION

The present invention relates to a semiconductor integrated circuit which provides a master slice LSI having a greater number of input/output terminals in comparison with its logic scale.

There is known "Rent's rule of thumb" with regard to a logic LSI that functionally "the relationship of Eq. (1) is existent between the logic scale G to be constituted (hereinafter referred to as "number of gates") and the number N of input/output terminals." (R. L. Russuo, "On the Trade-off between Logic Performance and Circuit-to-Pin Ratio for LSI", IEEE Transactions Computers, C21, pp. 147-153, Feb. 1972)

$$N \alpha G^\gamma \text{ (where } \gamma: 0.4-0.7\text{)} \quad (1)$$

Hereinafter Eq. (1) is represented simply by $N_G$.

Meanwhile the number N of terminals is prescribed by the number G of gates due to the structure because, in the master slice LSI with a gate array and so forth, input/output cells (including bonding pads) are formed previously in the master process of production.

In FIG. 2, there is shown a dicing line 1, a region 2 of gate-constituting elements (hereinafter abbreviated to BC), and a region 3 of input/output cells used restrictively for input and output alone.

In a conventional circuit, as illustrated, usually the input/output cells 3 are arrayed inside the dicing line 1 and along the periphery of the BC region 2. Consequently any increase in the number of gates brings about an increase of the BC region 2, thereby increasing the input/output region 3 in the periphery of the BC region 2 and hence the number ($N_p$) of input/output terminals furnished along the periphery.

When the level of miniaturization is on the order of 2 μm, the relationship of Eq. (2) is established as $$N_p \geq N_G \quad (2)$$

The surplus input/output regions 4 denoted by shaded portions in FIG. 3 are within the chip. It is therefore possible to determine the chip size merely on the basis of $N_G$. However, if the level of miniaturation is less than 2 μm, the BC region 2 becomes smaller so that the following relationship is established in most cases.

$$N_p < N_G \quad (3)$$

For achieving the relationship of Eq. (2), it is necessary to furnish a shortage of input/output terminals, whereby the requirement for dimensional extension of the chip is rendered inevitable. In FIG. 4, a shaded portion 5 denotes a hollow area (unusable area) of the BC region resulting from such a dimensional extension of the chip. In case such a hollow area 5 is used as the BC region, additional input/output terminals corresponding to the number of increased gates are required to eventually bring about a vicious cycle of necessitating further dimensional extensions of the chip.

In the conventional gate-array master slice LSI where the input/output cells are anchored only inside the dicing line, there has been a problem heretofore that, at any level of miniaturization under 2 μm, the chip needs to be dimensionally enlarged for ensuring the required number of input/output terminals.

SUMMARY OF THE INVENTION

The present invention has been accomplished in an attempt to eliminate the problems in the prior art mentioned above. Its object resides in providing a semiconductor integrated circuit to form required input/output terminals in accordance with any gate scale.

In the semiconductor integrated circuit of the present invention, a gate region and input/output cell regions in the periphery thereof are composed entirely of logic-constituting elements which are servable also as input/output cells, and the logic-constituting cells in the whole input/output cell regions and any desired portion of the gate region are formed as input/output cells in the slice process of production.

Consequently, in the present invention of the above structure, it becomes possible to form the input/output cells not only in the periphery of the chip but also in any desired portion thereof, hence realizing provision of input/output cells as a whole in conformity with $N_G$. Thus, the known necessity of enlarging the chip size to ensure the required number of input/output terminals can be eliminated.

BRIEF DESCRIPTION OF THE DRAWINGS

The entire drawings show the concept of a master slice chip, in which:

FIG. 5 shows a logic symbol of 3-input NAND gate and its electrical circuit, which is one of logic gates employed in the present invention;

FIG. 6 shows a brief layout pattern which constitutes a 3-input NAND gate using logic-constituting elements according to Gate Isolation method; and FIG. 7 shows a brief layout pattern which constitutes a 3-input NAND gate using logic-constituting elements according to Oxide Isolation method.

DETAILED DESCRIPTION OF THE PREFERRED EMBODIMENT

Figure 1:
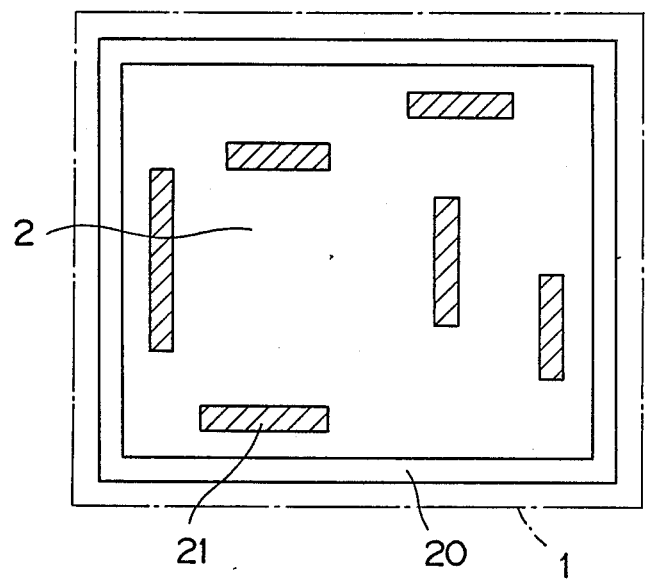
FIG. 1 is a conceptional view of an exemplary semiconductor integrated circuit embodying the present invention.
Figure 2:
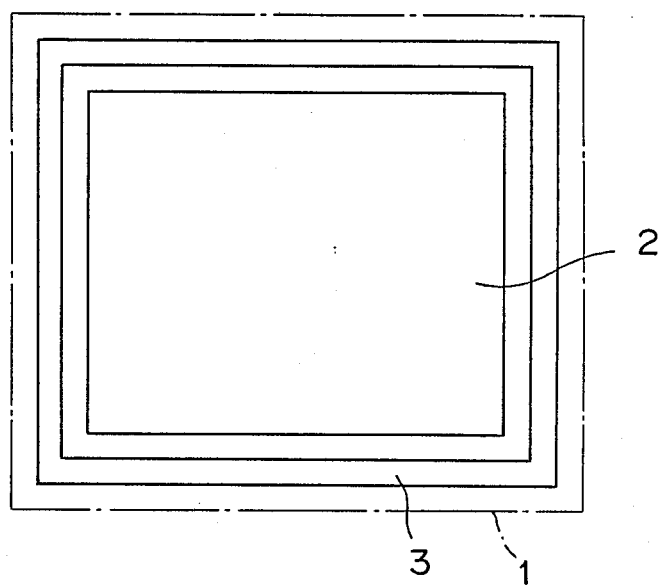
FIG. 2 is a conceptual view of a conventional master slice LSI.
Figure 3:
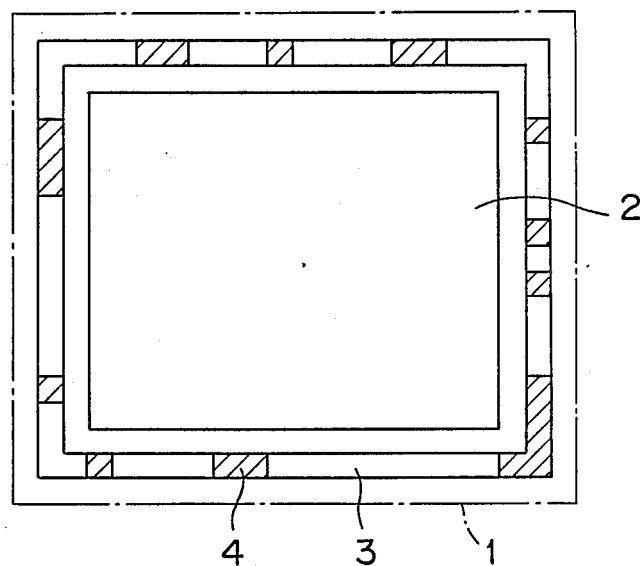
FIG. 3 is a conceptual view of an example where a circuit having the relationship of Eq. (2) is designed by the conventional method.
Figure 4:
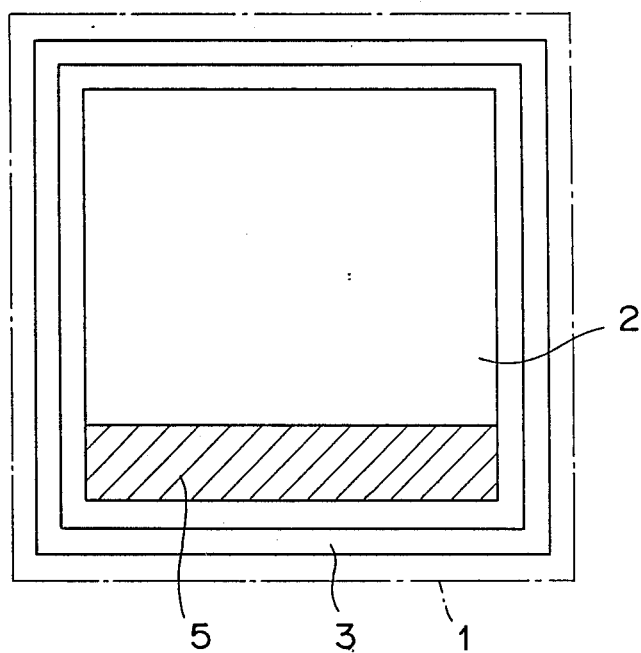
FIG. 4 is a conceptual view of an LSI where the relationship of Eq. (3) is dissolved by the known technique.

Hereinafter a preferred embodiment of the present invention will be described with reference to the accompanying drawings. FIG. 1 shows an exemplary semiconductor integrated circuit embodying the present invention, in which are shown a dicing line 1, a BC region 2 extending over the entire area of a chip, a first input/output cell region 20 composed of BCB cells which are positioned in the periphery of the chip within the BC region 2, and second input/output cell regions 21 composed of BCB cells additionally formed in the chip. In this embodiment, the BCB cells serve as basic cells (BC buffer cells) for constituting a logic circuit.

The term BCB stands for Basic Cell Buffer and it is composed of the basic cell for constituting a logic circuit.

A conventional input/output buffer as constituted by transistors disposed at an exclusive region in the periphery of the chip and is exclusively for input/output buffers in a size different from those for the logic circuits.

On the other hand, BCB is constituted in such a way that performance is equivalent to that of the conventional input/output buffers and is achieved by connecting a plurality of logic-constituting elements.

Therefore it is possible to use BCB cells as logic gates as well.

Supposing now in this circuit that the relationship of Eq. (3) is established, initially the first input/output cell region 20 is formed by the use of BCB cells at positions corresponding to the conventional input/output only cells in the periphery of the chip. Any shortage of the input/output cells can be supplemented with the second input/output cell regions 21 formed by the use of BCB cells in desired portions of the chip.

In this stage, the increase in the number of input/output terminals resulting from the addition of the second input/output cells 21 reduces the number of cells in the gate region 2, so that there always exists an equilibrium point with respect to the number of the input/output terminals and that of the gates, whereby it is possible to design a satisfactory LSI in which no hollow region is existent within the chip.

As described hereinabove, in the semiconductor integrated circuit of the present invention where its input/output cells are composed of logic-constituting BC (basic cells), any required number of input/output cells can be formed regardless of the number of input/output terminals to eventually eliminate the unusable input/output cell region, hence enhancing the effective gate density in the master slice LSI.

What is claimed is:

1. A large scale semiconductor integrated circuit comprising:
    a substrate;
    a gate region formed on said substrate;
    an I/O region formed at a periphery of said gate region; and
    a plurality of cell arrays formed in said gate region and said I/O region, the cell arrays in said gate region being formed as logic elements which can function as either of I/O cells and gate cells, some of the cell arrays in said gate region functioning as said I/O cells.

2. A large scale semiconductor integrated circuit comprising:
    a plurality of cell arrays formed on a chip;
    said cell arrays function as either of I/O cells and gate cells;
    some of said cell arrays, functioning as the I/O cells, forming a peripheral region of the chip, some others of said cell arrays, functioning as the gate cells, forming a gate region surrounded by said peripheral region; and
    at least one of the cell arrays, within the region in which gates cells are formed, being arranged to form the I/O cell.

3. A large scale semiconductor integrated circuit comprising:
    a substrate;
    a gate region formed on said substrate;
    an I/O region formed at a periphery of said gate region; and
    a plurality of cell arrays formed in said gate region and said I/O region, said cell arrays in said gate region being formed as logic elements, said logic elements including a first group functioning as gate cells and a second group functioning as I/O cells.

* * * * *